US005677562A

United States Patent [19]

Korwin-Pawlowski et al.

[11] Patent Number: 5,677,562
[45] Date of Patent: Oct. 14, 1997

[54] PLANAR P-N JUNCTION SEMICONDUCTOR STRUCTURE WITH MULTILAYER PASSIVATION

[75] Inventors: Michael L. Korwin-Pawlowski, Cork City; Jean-Michel Guillot, Cloyne; James J. Brogle, Cork City, all of Ireland

[73] Assignee: General Instrument Corporation of Delaware, Hatboro, Pa.

[21] Appl. No.: 649,135

[22] Filed: May 14, 1996

[51] Int. Cl.$^6$ .................................................. H01L 23/58
[52] U.S. Cl. ...................... 257/490; 257/494; 257/495; 257/636; 257/640; 437/233; 437/239; 437/244
[58] Field of Search ........................... 257/490, 494, 257/495, 546, 636, 640, 649; 437/233, 237, 239, 244

[56] References Cited

U.S. PATENT DOCUMENTS

| | | | |
|---|---|---|---|
| 3,890,698 | 6/1975 | Clark | 29/577 |
| 3,911,473 | 10/1975 | Nienhuis | 357/52 |
| 4,009,483 | 2/1977 | Clark | 357/52 |
| 4,081,292 | 3/1978 | Aiki et al. | 148/1.5 |
| 4,086,613 | 4/1978 | Biet et al. | 357/54 |
| 4,125,415 | 11/1978 | Clark | 148/1.5 |
| 4,157,563 | 6/1979 | Bosselaar | 357/53 |
| 4,344,985 | 8/1982 | Goodman et al. | 427/85 |
| 4,375,125 | 3/1983 | Byatt | 29/588 |
| 4,399,449 | 8/1983 | Herman et al. | 357/53 |
| 4,412,242 | 10/1983 | Herman et al. | 357/52 |
| 4,573,066 | 2/1986 | Whight | 357/52 |
| 4,599,638 | 7/1986 | Flohrs | 357/51 |
| 4,602,266 | 7/1986 | Coe | 357/20 |
| 4,605,948 | 8/1986 | Martinelli | 357/34 |
| 4,648,174 | 3/1987 | Temple et al. | 29/578 |
| 4,672,738 | 6/1987 | Stengl et al. | 29/576 B |
| 4,707,719 | 11/1987 | Whight | 357/53 |
| 4,750,028 | 6/1988 | Ludikhuize | 357/52 |
| 4,774,560 | 9/1988 | Coe | 357/52 |
| 4,778,776 | 10/1988 | Tong et al. | 437/228 |
| 4,927,772 | 5/1990 | Arthur et al. | 437/6 |
| 4,978,636 | 12/1990 | Jackson | 437/150 |
| 4,999,683 | 3/1991 | Kiyomura et al. | 357/13 |
| 5,028,548 | 7/1991 | Nguyen | 437/15 |
| 5,032,878 | 7/1991 | Davies et al. | 357/13 |
| 5,060,047 | 10/1991 | Jaume et al. | |
| 5,066,991 | 11/1991 | Jackson | 357/13 |
| 5,075,739 | 12/1991 | Davies | 357/13 |
| 5,083,176 | 1/1992 | Slatter | 357/30 |

OTHER PUBLICATIONS

Article entitled "High–Voltage Planar Devices Using Field Plate and Semi–Resistive Layers", by D. Jaume et al, IEEE Transactions on Electron Devices, vol. 38, No. 7, Jul. 1991, pp. 1681–1684.

Article entitled "High–Voltage Planar Structure Using $SiO^2$–SIPOS–$SiO_2$ Film", by A. Mimura et al., IEEE Electron Device Letters, vol. EDL–6, No. 4, Apr. 1995, pp. 189–190.

An article entitled "Net Negative Charge Effect In $p^+n$ Planar Structures" by I. Ghita et al., 1981, Review of Romanian Physics, vol. 29, No. 8, pp. 743–749.

An article entitled "Drift of the Breakdown Voltage in p–n Junctions in silicon (Walk Out)", by J.F. Verwey et at., 1977, Solid State Electronics, vol. 20, pp. 689–695.

Primary Examiner—Ngân V. Ngô
Attorney, Agent, or Firm—Irwin Ostroff; Arthur J. Torsiglieri

[57] ABSTRACT

A semiconductor device, which has a silicon body that includes at least one planar p-n junction that intersects a surface of the body, uses a multilayer arrangement that includes a first layer of thermally grown silicon dioxide, a second layer of Chemical-Vapor-Deposited (CVD) silicon nitride, a third layer of CVD oxygen-rich polysilicon, and a fourth layer of CVD silicon dioxide to passivate the junction. Common metallization contacts both the diffused region of the planar junction and the oxygen-rich polysilicon.

10 Claims, 1 Drawing Sheet

PLANAR P-N JUNCTION SEMICONDUCTOR STRUCTURE WITH MULTILAYER PASSIVATION

FIELD OF THE INVENTION

The present invention relates to methods of manufacturing a semiconductor device having a planar p-n junction, such as a semiconductor diode, transistor, thyristor, or integrated circuit, and to the products of such methods.

BACKGROUND OF THE INVENTION

One widely used technology for manufacturing semiconductor wafers for diodes, transistors and other devices is the planar technology. This technology consists of diffusing a p-n junction locally in a semiconductor wafer through an opening etched in a dielectric layer previously formed on the surface of the wafer, the dielectric chosen being such that it can act both as a diffusion mask and to provide passivation for the junction. As the term is used in the art, passivation is the stabilization of the properties of the junction over time and this typically involves shielding the junction from ions that might affect its properties. Planar junctions have found application as rectifying junctions in diodes, transistors, thyristors, and integrated circuits.

Planar wafers may contain a single active area to be used whole in a semiconductor device or may be made up of many separate active areas which, after dicing, are used to manufacture many semiconductor devices out of a single wafer.

Planar p-n junctions are usually passivated with multilayer dielectric films usually including one or more of silicon oxides (both doped and undoped), silicon nitride, semi-insulating polysilicon, and other materials.

An important advantage of the planar technology over the alternative mesa technology is that the planar wafers have a basically flat surface. This makes photolithography easier and lowers mechanical breakage, which makes manufacturer easier and less expensive. Mesa technology uses deep grooves etched between the active areas of individual devices and p-n junctions are made to intersect the side walls of the mesa, which then also need to be passivated. The difficulty of realizing for p-n junctions breakdown voltages close in value to theoretical predictions for ideal flat junctions is one problem associated with planar technology. Another problem is the difficulty of providing long-lasting and reliable passivation for the junction, which is needed to maintain its initial electric characteristics through the design lifetime of the device.

A large number of techniques have been used in the past to solve the passivation problem. This problem has become more difficult as the reverse bias voltages needed increase.

A simple silicon dioxide layer of sufficient thickness can be used to mask against diffusion of boron, phosphorus and other usual dopants into silicon. The junction passivation properties of such layers however are not satisfactory since silicon dioxide alone does not provide protection against penetration by mobile ions, as of sodium and potassium, a factor leading to breakdown voltage instability. As a result, drift of the breakdown voltage (walk-out) is generally found in junctions passivated simply by silicon dioxide.

A layer of silicon dioxide doped on the surface with both phosphorus, and boron to form a phosphoro-borosilicate glass on the surface has been used as planar passivation. The passivation properties of such glassy layers are generally adequate for low-voltage devices, but generally are not sufficient to adequately passivate high-voltage devices.

To protect planar junctions against mobile ions, a layer of silicon nitride has been used on top of silicon dioxide, with phosphorus pentoxide and boron trioxide layers over the nitride (see, for example, U.S. Pat. Nos. 4,963,509, 4,978, 636, and 5,066,991). However, instabilities have been observed in such structures (Ref: Ghita et al. Rev. Roum. Phys., Tome 29, No. 8, pp. 743–749).

Oxygen-doped polycrystalline silicon layers, generally described as semi-insulating polysilicon (SIPOS), have also been used in planar technology as passivation layers, as described in U.S. Pat. Nos. 4,014,037 and 4,063,275 and in an article by Mimura et al. in IEEE Electron Dev. Letters, Vol. EDL-6, No. 4, April 1985, pp. 189–192. One role of the SIPOS layer is to prevent the accumulation of mobile ions in the region of the junction by an electric field that is created in the SIPOS layer. This results in a more stable breakdown voltage. Another role of the SIPOS layer is to spread the depletion region so as to decrease the surface electric field. This results in a junction breakdown voltage that is closer to ideal.

Also, to improve the breakdown voltage of planar p-n junctions, doped regions have been formed by diffusion techniques in the semiconductor wafer around the p-n junction periphery concentrically with it and at a suitable spacing from it. Such regions may be of the conductivity type opposite that of the diffused region of the planar junction and form so-called channel stops or stoppers, or be of the same conductivity type as the diffused region of the planar junction and form so-called guard rings. These serve both to reduce the electric field at the surface of the wafer and to make the electronic field more uniform there. The guard rings are normally located between the planar p-n junction edge and the channel stop, if the latter are also used. There may be one or more guard rings around a p-n junction. There are many versions of guard ring structures, either with or without channel stoppers.

Despite all this prior effort, there appears still to be room for improvement in passivation techniques, particularly for devices that include planar junctions apt to experience high reverse voltages and to suffer, if the reverse currents are too high or drift with use.

It is desirable to solve this problem by providing a passivation technique for such devices that is highly reliable and involves simply a plurality of superposed layers for each of which the processing is well established.

SUMMARY OF THE INVENTION

The present invention achieves the desired passivation of a planar junction silicon device by a plurality of dielectric layers superposed over the region where the planar junction to be passivated intersects the surface of the silicon body of the device. In particular, the first layer contiguous to the surface and overlying the planar junction is a layer of a thermally-grown silicon dioxide, advantageously with a phosphoro-borosilicate glassy outer surface. Over this lies in turn a layer of undoped silicon nitride, a layer of oxygen-rich semi-insulating polysilicon (SIPOS), and a chemical-vapor-deposited (CVD) layer of silicon dioxide. Each of these layers may be formed in turn by known formation technologies.

Advantageously, there is also included an electrode that overlies the multi-layer and that makes electrical contact both to the diffused layer that forms the planar junction and to the layer of oxygen-rich semi-insulating polysilicon of the multilayer.

Each of the layers plays a distinct role. The initial thermally-grown oxide serves to convert the layers of silicon atoms at the surface that tend to have dangling bonds to silicon dioxide thereby improving the crystalline nature of the surface and making it electrically sturdier. The silicon nitride layer over the thermally-grown silicon dioxide serves to protect the junction against mobile ions of the kind that tend to give rise to breakdown voltage instability, such as of sodium. The role of the polysilicon layer is to provide an electric field that tends to remove from the neighborhood of the junction any mobile ions that nevertheless get to such neighborhood. The polysilicon layer also provides a semi-insulating current path field shield. This extends the depletion region and lowers the electric field at the silicon surface. The role of the chemical-vapor-deposited silicon dioxide outer layer is to provide mechanical protection to the relatively fragile SIPOS layer. The silicon nitride layer also serves to separate the SIPOS layer from the initial thermally grown silicon dioxide layer.

Additionally, if desired, the silicon device may include, on the surface intersected by the planar junction and positioned to surround the junction, guard ring zones (regions) and/or channel stop zones (regions), as is known in the art.

From one aspect the invention may be viewed as a planar junction silicon device having a multilayer passivation structure of the kind described.

From another aspect the invention may be viewed as a process for manufacturing a planar junction silicon device that includes the steps of providing the succession of dielectric layers described for the passivation of the planar junction.

Viewed from one aspect, the present invention is directed to a silicon semiconductor device comprising a silicon body that includes at least one planar diffused junction that intersects a surface of the silicon body and is expected to be subject to reverse voltages and passivating layers for such a junction. These passivating layers comprise a layer of a thermally-grown silicon dioxide, a layer of silicon nitride, a layer of oxygen-rich semi-insulating polysilicon, and a layer of chemical-vapor-deposited silicon dioxide, superposed on one another over the intersection of the junction with the surface.

Viewed from an other aspect, the present invention is directed to a method for fabricating a semiconductor device that includes a silicon body that has at least one planar junction intersecting a surface of the silicon body that comprises the steps of: first heating the silicon body in an oxidizing atmosphere for a time and at a temperature to grow a layer of silicon dioxide on the surface of the silicon body where it is intersected by the rectifying junction; the depositing by chemical-vapor-deposition a layer of silicon nitride over the layer of silicon dioxide; then depositing by chemical-vapor-deposition a layer of oxygen-rich semi-insulating polysilicon over the layer of silicon nitride; and then depositing by chemical-vapor-deposition a layer of silicon dioxide over the layer of oxygen-rich polysilicon.

The invention will be better understood from a consideration of the following detailed description taken in conjunction with the accompanying drawing.

BRIEF DESCRIPTION OF THE DRAWINGS

The FIGURE is a cross sectional view of a silicon diode in accordance with the present invention.

It is to be noted that the drawing is schematic and not to scale.

DETAILED DESCRIPTION

Figure 1:
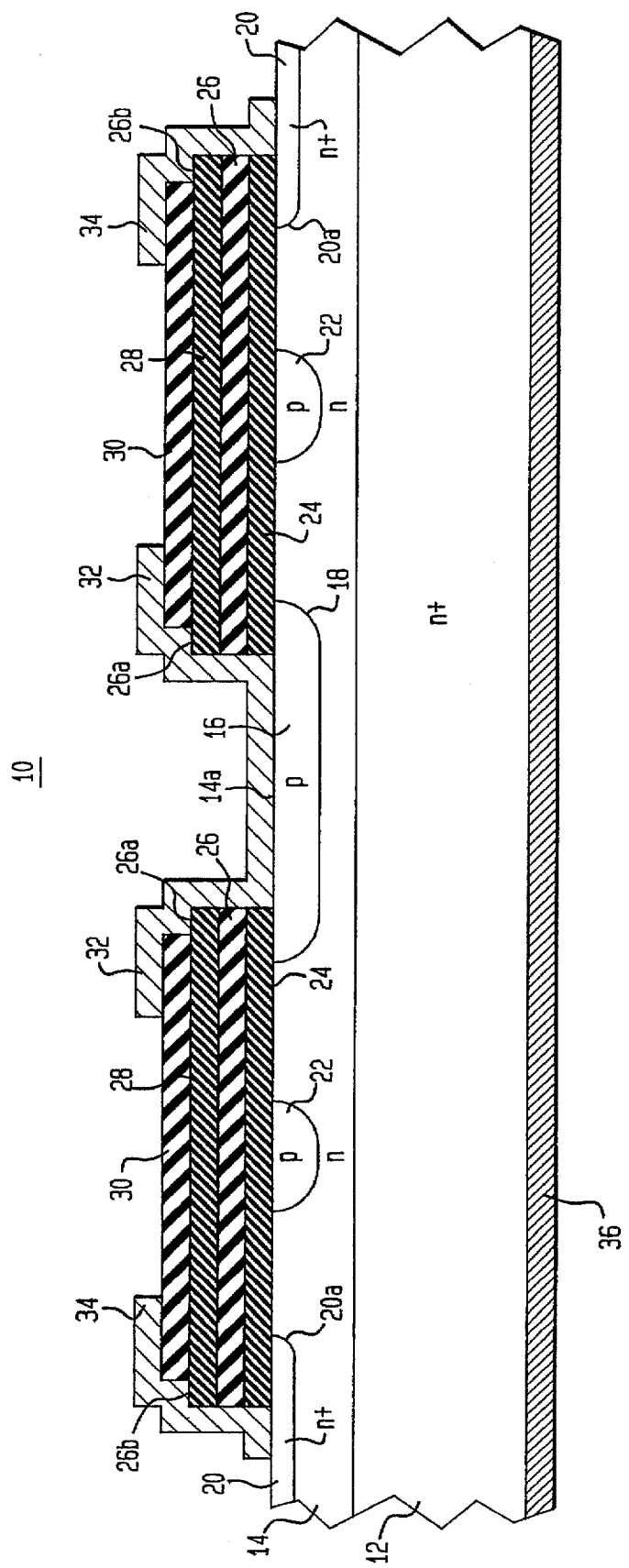

The single FIGURE shows a silicon diode 10 in accordance with the present invention. The discussion will be in terms of a single diode although typically many such diodes are fabricated from one wafer, as was previously mentioned and as is well known in the art.

The silicon diode 10 depicted is of a design primarily for use in a high voltage rectifier. Diode 10 comprises a bulk portion 12 that is typically heavily doped n-type silicon on top of which there has been formed a layer 14 that is predominantly of higher resistivity N-type silicon than that of the bulk portion 12. Typically the layer 14, which has a top (upper) surface 14a, will have been grown as an epitaxial layer on a monocrystalline bulk substrate 12.

Formed in a portion of the epitaxial layer 14 is a diffused zone (region) 16 that is of p-type conductivity and forms with layer 14 a planar p-n junction 18 that intersects the top surface 14a of the layer 14. It is the region of this intersection that is generally the most vulnerable and needs most to be passivated. In this embodiment the epitaxial layer 14 includes both a channel stop 20 and a guard ring 22.

The channel stop 20 is a diffused region in a portion of layer 14 and is more heavily doped n-type than the epitaxial layer. It forms the n–n+ junction 20a that also intersects the top surface 14a and the region of such intersection also may be vulnerable and so warrants passivation.

The guard ring 22 is typically a diffused region formed in part of layer 14 and is of the same p-type conductivity as the diffused zone 16. It is inserted to surround the diffused region 16 and in turn to be surrounded by the channel stop 20, as is known in the art. It generally is formed at the same time as is formed the diffused zone 16.

In an illustrative embodiment useful for an ultrafast diode rectifier with a breakdown voltage of over 600 volts, the n+ type bulk (substrate) 12 had a resistivity below 0.005 ohm-centimeter and the epitaxial layer 14 had a thickness of between 75 and 85 micrometers and a resistivity of between 18 and 22 ohm-centimeter.

The silicon diode 10 was prepared as follows. A layer of silicon dioxide 24 of thickness (12,000 A) adequate to serve as a mask was first formed over the surface of the epitaxial layer, for example, by heating for 3.5 hours at 1100 degrees centigrade in an oxidizing atmosphere, such as in wet oxygen. The top surface 14a was then coated with a layer of photoresist, which was then patterned photolithographically in known fashion to serve as a mask for the diffusion of boron into the surface to form the p-type zone 16 and creating the p-n junction 18. When, as is the case in this embodiment, the guard ring 22 is included, the mask is opened also to permit its formation at the same time as the diffused zone 16 is being formed.

To this end, for the diffusion there was used a two-step process that included first a predeposition of boron from a solid source, such as GS-245 supplied by the Owens-Illinois Company, and a subsequent drive-in to provide a depth of about 20 micrometers and a sheet resistance of between 2 and 3 ohms per square for the layer 16 and the guard ring 22.

The channel stop 20 is later formed by the diffusion of phosphorus in a similar two-step diffusion process. However, to localize the phosphorous diffusion to the desired location, in known fashion the surface of the wafer is again covered with an oxide, typically of at least 10,000 Angstrom units thickness in the regions overlying regions 16 and 22 serves as a mask to protect against unwanted phosphorus diffusion except in the desired channel stop and a window is opened in the oxide for the phosphorus diffusion to form the channel stop 20. Typically growth of this oxide layer little increases further the thickness of the earlier-grown silicon dioxide layer, as is known in the art, but there results a phosphoro-borosilicate glassy surface over the layer 24.

Phosphorus diffusion is done either using solid phosphorus sources or gaseous phosphorus sources. An example of a phosphorous solid source that can be used is denoted as "Phosphorus Plus" supplied by Owens-Illinois Co. There was formed an N+ type region 20 about 5 micrometers deep having a sheet resistance of about 1 ohm per square. The phosphorous diffusion advantageously was followed by a quick deglaze etch in a buffered hydrochloric acid solution.

Because both the boron and phosphorous diffusion steps are isotropic, the diffusants move both laterally and downward during the drive-in diffusion so that the junctions 18 and 22 intersect the surface of the silicon body 10 tucked underneath the silicon dioxide oxide mask 24, as is depicted in the drawing.

Once both junctions 18, 22 are in place, one can proceed with putting the various additional passivation layers in place over the oxide layer 24 that was formed initially to localize the zones 16 and 20.

Each of three dielectric layers that are superposed over the silicon dioxide layer 24 is advantageously formed by known chemical-vapor-deposition technology, advantageously of the low-pressure type. In the illustrative embodiment, a layer 26 of silicon nitride is deposited to a thickness of 2,000 plus or minus 300 Angstrom units over layer 24, and a layer 28 of undoped oxygen-rich semi-insulating polysilicon (SIPOS) of a thickness between 7,500 and 10,000 Angstrom units is deposited over layer 26. A final dielectric layer 30 of silicon dioxide is deposited to a thickness of 10,000 plus or minus 1000 Angstrom units over layer 28, preferably by a low temperature process to minimize further diffusion of the diffusants that were earlier introduced into the zones 16, 20, and 22.

There now remains the need to provide to the top surface of the layered-covered silicon body the metallization that is to be patterned to make necessary electrical contacts 32 and 34 to the silicon body for use as a device.

In the illustrative embodiment, in known fashion, photolithographic technology was used to form vias or contact windows in the layers so that a deposited layer, typically of a metal such as aluminum, could be patterned to form the electrical contact 32 to the zone 16 and the electrical contact 34 to the zone 20.

Advantageously, for forming the vias the silicon dioxide layer 30 was etched in a buffered hydrofluoric acid solution, the SIPOS layer 28 was etched in an acid mixture of nitric acid, hydrofluoric acid, and deionized water, and the silicon nitride layer 26 was etched by a dry plasma etching process. By suitably adjusting the etching time of the silicon dioxide layer 30, a step is formed so that rings 26a and 26b of the SIPOS layer 26 are exposed to allow these portions 26a and 26a to be contacted by the metallization layers 32 and 34, respectively.

As an alternative to aluminum for the metallization, there can be used a known triple layer metallization system comprising a bottom layer of titanium, an intermediate layer of nickel, and an upper layer of silver, each deposited by evaporation. The aluminum layer first-mentioned is used preferably for use with ultrasonic bonded connections and the triple layer for soldered connections.

After the topside processing has been completed, the wafer is generally thinned in known fashion by removing silicon from the backside of the bulk portion 12 to reduce the series resistance of the diode. Typically either grinding or etching is used for this purpose. After this, metallization, which may be of the same kind as used on the topside, can be deposited on the back surface to provide electrical connection via an electrode 36 to the silicon bulk 12.

Additionally, as is known, if it is desired to provide short reverse recovery times, it is advantageous to incorporate atoms of materials, such as gold or platinum, to speed up the recombination of free carriers of opposite polarity important to hasten the switching action of diodes. For example, to this end a thin film of gold (not shown) may be deposited by vacuum evaporation over the top surface of the wafer as part of the process, after the described diffusions and the forming of the three dielectric layers and the patterning of them for metallization, and then diffused throughout the wafer by heating to a temperature of about 940° centigrade.

It is to be understood that the specific embodiment described is merely illustrative of the basic principles of the invention and various variations are possible without departing from the basic principles. For example, in some instances it may be unnecessary to include guard rings or channel stoppers, as discussed. Still further, the conductivity types of the regions (zones) may be reversed. Furthermore, while the invention has been described with reference to the passivation of a rectifier diode, the principles are similarly applicable to transistors and thyristors, with emphasis on the junctions that need to withstand high reverse voltages in such devices.

What is claimed is:

1. A silicon semiconductor device comprising a silicon body including at least one planar diffused junction that intersects a surface of the silicon body and is expected to be subject to reverse voltages and passivating layers for such junction comprising a layer of a thermally-grown silicon dioxide, a layer of silicon nitride, a layer of oxygen-rich semi-insulating polysilicon, and a layer of chemical-vapor-deposited silicon dioxide superposed on one another over the intersection of the junction with the surface.

2. The silicon semiconductor device of claim 1 further comprising over the layer of chemical-vapor-deposited silicon dioxide a layer of metal that makes electrical contact to both the diffused one of the two zones that form the junction and to the polysilicon layer.

3. The silicon semiconductor device of claim 2 in which the silicon body includes a channel stop diffused region and a layer of metal makes electrical contact both to the channel stop diffused region and to the polysilicon layer.

4. The silicon semiconductor device of claim 2 in which the silicon body includes a guard ring.

5. The silicon semiconductor device of claim 3 in which the silicon body includes a guard ring.

6. A method for fabricating a semiconductor device that includes a silicon body that has at least one planar junction intersecting a surface of the silicon body that comprises the steps of:

heating the silicon body in an oxidizing atmosphere for a time and at a temperature to grow a layer of silicon dioxide on the surface of the silicon body where it is intersected by the rectifying junction;

depositing by chemical-vapor-deposition a layer of silicon nitride over the layer of silicon dioxide;

depositing by chemical-vapor-deposition a layer of oxygen-rich semi-insulating polysilicon over the layer of silicon nitride; and depositing by chemical-vapor-deposition a layer of silicon dioxide over the layer of oxygen-rich polysilicon.

7. The method of claim 6 further comprising the step of forming a phosphoro-borosilicate glassy surface layer over the thermally-grown layer of silicon dioxide before depositing thereover the layer of silicon nitride.

8. The method of claim 7 in which the deposited layer of silicon dioxide uses a low-pressure and low temperature chemical-vapor-deposition step.

9. The method of claim 8 in which the first grown layer has a thickness of about 12,000 Angstroms units, the silicon nitride layer has a thickness of about 2,000 Angstrom units, the oxygen-rich polysilicon layer is between 7,500 and 10,000 Angstrom units thick, and the deposited silicon dioxide layer has a thickness of about 10,000 Angstrom units.

10. The method of claim 6 that further includes the step of depositing over the layer of chemical-vapor-deposited silicon dioxide a layer of metal that makes electrical contact both to the surface of the silicon body and to the polysilicon layer.

* * * * *